United States Patent [19]

Imamura

[11] Patent Number: 4,928,838

[45] Date of Patent: May 29, 1990

[54] TRIMMING PROCESS BY A LASER BEAM

[75] Inventor: Kaoru Imamura, Kawasaki, Japan

[73] Assignee: Kabushiki Kaisha Toshiba, Kawasaki, Japan

[21] Appl. No.: 293,278

[22] Filed: Jan. 4, 1989

[30] Foreign Application Priority Data

Jan. 13, 1988 [JP] Japan .................................. 63-5566

[51] Int. Cl.⁵ .............................................. B23K 26/00
[52] U.S. Cl. ............................................... 219/121.69
[58] Field of Search ...................... 219/121.68, 121.69, 219/121.6, 21.85

[56] References Cited

U.S. PATENT DOCUMENTS 4,272,775  6/1981  Compton et al. ............. 219/121.6 X
4,374,314  2/1983  Deacutis ..................... 219/121.68 X
4,644,130  2/1987  Bachmann ..................... 219/121.69

Primary Examiner—C. L. Albritton
Attorney, Agent, or Firm—Finnegan, Henderson, Farabow, Garrett and Dunner

[57] ABSTRACT

A trimming process by a laser beam is disclosed. The trimming process comprises two steps. In a first step, a laser shield layer is formed over an untrimmed region of a trimmed material adjacent to a trimmed region. The laser shield layer has a higher heat conductivity than the trimmed material and a large reflectivity for laser beam. In a second step, the trimmed material is cut off. To cut off, a laser beam is applied onto the upper surface of the trimmed region of the trimmed material to vaporize the trimmed material in the trimmed region.

14 Claims, 4 Drawing Sheets

FIG. 1A
(PRIOR ART)
FIG. 1B
(PRIOR ART)
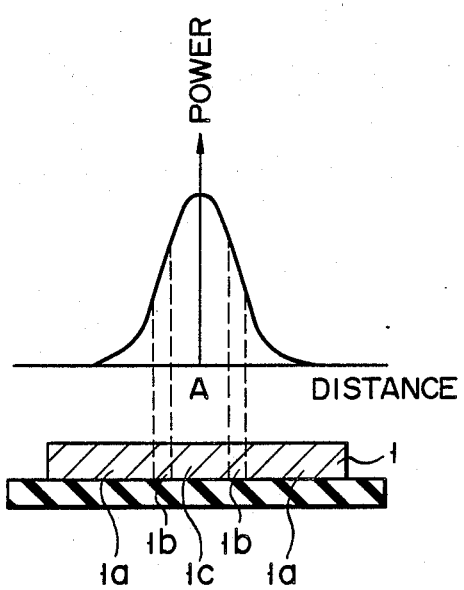
FIG. 1C
(PRIOR ART)
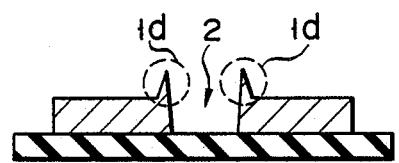

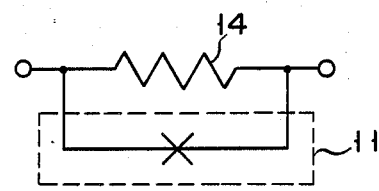
F I G. 2D
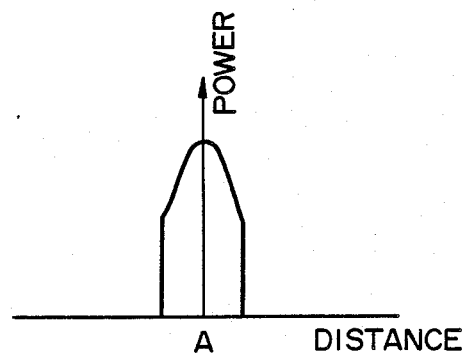
F I G. 2E
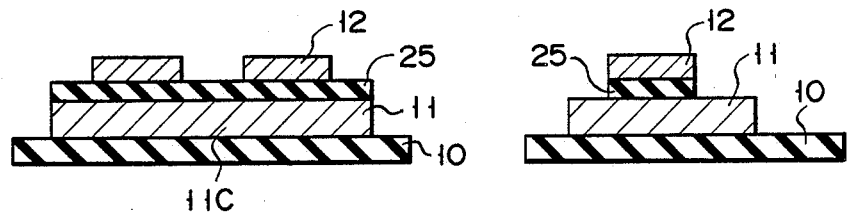
F I G. 4   F I G. 5

TRIMMING PROCESS BY A LASER BEAM

BACKGROUND OF THE INVENTION

1. Field of the Invention

The present invention relates to a trimming process for trimming a thin film resistor, for example, by a laser beam.

2. Description of Related Art

In recent semiconductor integrated circuits and hybrid integrated circuits, a functional laser trimming process has been used because the product processed by it has high precision output characteristics.

The trimming process by a laser beam allows an operator to trim or delineate an integrated circuit on a chip without any electrical contact with the integrated circuit. A major factor to determine the output characteristics of the integrated circuit is, for example, a resistance of a resistor of an integrated circuit. The desired resistance is obtained by the following steps: a proper resistance is initially set up, the integrated circuit is operated, and a resistance of the resistor is finely adjusted using cutting or trimming it by a laser beam till a desired resistance is obtained, while observing the output characteristics. This process is called functional laser trimming.

The process for adjusting a resistance of a resistor comes in two varieties. In a first resistance adjusting process, the resistance is adjusted by changing the direction of the lines of electric force. To this end, a resistive film is groove worked. In a second resistance adjusting process, a resistor network consisting of a plurality of resistor elements is used. To adjust a resistance of the resistor network, the resistor network is partially cut off to change a connection in the network.

A trimming mechanism of the trimming process based on a laser beam will be described for explaining what problem exists in a conventional laser beam trimming process. A conceptual illustration of a power distribution of an irradiating laser beam is given in FIG. 1A. In the figure, the abscissa of the graph represents an extension of a beam spot in the radial direction. The ordinate represents a power of the laser beam spot. During the trimming process, the beam spot is moved in the direction orthogonal to a plane of the drawing. As shown, a distribution of the laser power is a Gaussian distribution in which a peak power exists at point A as the center of the beam spot, and the peak power gradually decreases toward the peripheral side of the beam spot. FIG. 1B shows a state of a trimmed workpiece or material 1 when it is irradiated with a laser beam. Under this condition, trimmed material 1 absorbs energy of the laser beam. The absorbed laser energy is converted into a corresponding thermal energy, so that trimmed material 1 is heated. Portion 1a distanced from the center of the laser beam spot is a solidus region which is heated by the thermal energy resulting from the absorbed laser energy. An amount of heat value increases toward the center of the laser beam, and a melting point of the trimmed material is reached to form melting region 1b. In a region 1c in the vicinity of the center of the beam spot the temperature further rises above the melting point to reach a boiling point, and the trimmed material in this region is vaporized, so that the trimmed material in vaporizing region 1c is evaporated and cut off. In this way, the trimming process is performed. A vapor force during the vaporizing of the trimmed material pulls up part of melting region 1b, so that protruded portion 1d appears at the fringe of trimmed portion 2 of the trimmed material after the trimming process is completed, as shown in FIG. 1c. When a protecting film is applied over the substrate including the trimmed portion after the trimming process is completed, the protecting film loses the uniformity in thickness or becomes thin at protruded portion 1d. Sometimes, minute holes like pinholes or discontinuous or uncovering portions are found in the protecting film thereat.

The products manufactured by the conventional trimming process inevitably suffer from pinholes or uncovered portions of the protecting film and in this respect, are poor in humidity-resistance and hence will develop rust and other corrosion problems.

SUMMARY OF THE INVENTION

Accordingly, an object of the present invention is to provide a trimming process by which no protruded portion is formed at the fringe of the trimmed portion of a trimmed material when it is trimmed, and a protecting film covering a substrate maintains its reliability long after the trimming process is completed.

According to the present invention, there is provided a trimming process by a laser beam comprising the steps of: forming a laser shield layer over an untrimmed region of a trimmed material adjacent to a trimmed region, the laser shield layer having a higher heat conductivity than the trimmed material and a large reflectivity for laser beam; and cutting off the trimmed material by applying a laser beam onto the upper surface of the trimmed region of the trimmed material and vaporizing the trimmed material in the trimmed region.

In the trimming process, when the trimmed material is irradiated with the laser beam, the laser shield layer is also subjected to the laser beam. The laser beam applied to the laser shield layer is weaker than that at the center of the laser spot. Additionally, the shield layer has a large reflectivity. Therefore, an amount of the laser energy absorbed directly by the laser shield layer is small. The trimmed material in the untrimmed region is shielded from the laser beam by means of the laser shield layer, but is heated by the heat transferred from the cut-off region. It is noted here that the heat conductivity of the laser shield layer is good, and therefore most of the heat from the cut-region is shunted toward the shield layer, whereas little heat is transferred to the trimmed material in the untrimmed region. The melting region possibly causing that protruded portion is extremely narrow. Further, the laser shield layer covers the narrow melting region. Consequently, the possibility that the fringe of the trimmed region would be protruded after irradiation of the laser beam, is remarkably reduced. An experiment conducted by the invention showed that little protrusion was formed on the fringe.

BRIEF DESCRIPTION OF THE DRAWINGS

FIGS. 1A through 1C are views for explaining a conventional trimming process by a laser beam, in which FIG. 1A is a graph illustrating a distribution of intensities of a laser beam, FIG. 1B a sectional view showing a trimmed material layered on a substrate before the material is trimmed, and FIG. 1C a sectional view showing the structure of FIG. 1B after the material is trimmed;

FIGS. 2A through 2E are views for explaining a trimming process by a laser beam according to an embodiment of the present invention, in which FIG. 2A is a sectional view showing a trimmed material layered on a substrate before the material is trimmed, FIG. 2B and 2C sectional and plane views of the structure of FIG. 2A after the material is trimmed, FIG. 2D a circuit diagram showing how the trimmed material is used, and FIG. 2E a graph showing a distribution of intensities of laser power absorbed by the trimmed material;

FIGS. 3A through 3C are views for explaining a trimming process by a laser beam according to another embodiment of the present invention, in which FIG. 3A is a plane view showing a trimmed material layered on a substrate after the material is trimmed, FIG. 3B a sectional view along lines 3B—3B in FIG. 3A and FIG. 3C a circuit diagram showing how the trimmed material is used; and FIGS. 4 and 5 show sectional views showing the structure including trimmed material before the material is trimmed, the illustration for explaining other embodiments.

DETAILED DESCRIPTION OF THE PREFERRED EMBODIMENTS

A first embodiment of a trimming process by a laser beam according to the present invention will be described with reference to FIGS. 2A through 2E.

Figure 2A:
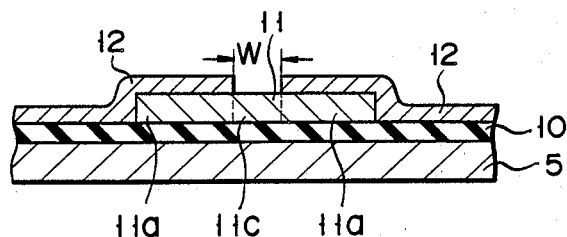
Figure 2B:
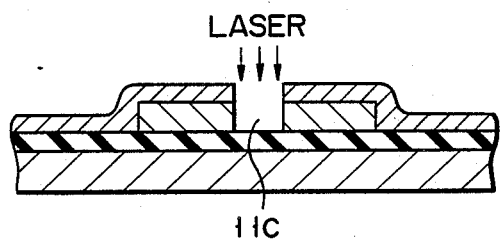
Figure 2C:
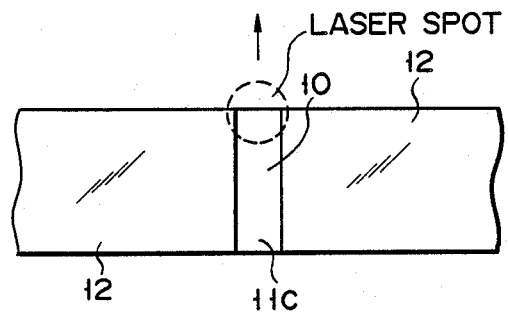

As shown in FIG. 2A, poly-silicon, approximately 5000 Å thick, is deposited, by the CVD process, over insulating (thermal silicon oxide) film 10, which has been layered on a semiconductor substrate, e.g., silicon substrate 5. Boron ions are implanted in the polysilicon, to form a shorting polysilicon layer of extremely small resistance, i.e., trimmed material 11. The insulating material may be any other suitable material other than silicon oxide, for example, PSG glass or silicon nitride. The insulating layer has preferably a thickness of 1.2 $\mu$ or more, because such thickness prevents an adverse effect on silicon substrate 5 in the processings to be given later. A metal film, which has a higher reflectivity for a laser beam than the polysilicon layer and also has a large heat conductivity, is applied over silicon substrate 5 and polysilicon layer 11. Then, the film is patterned to have an opening or a slit on a trimmed region 11c, through which polysilicon layer 11 is exposed. In this way, shield metal film (laser shield layer) 12 is formed. For simplifying a manufacturing process of the product, the step of forming shield metal film 12 may preferably be made at the same time of forming electrode wiring pattern. That is, the shield metal film 12 and the electrode wiring pattern for the resist film may be formed by only one step of depositing metal and patterning the same. Shield metal film 12 is preferably made of any of aluminum, gold and platinum, or material essentially consisting of aluminum doped with impurity of silicon and/or copper. Generally, the thickness of shield metal film 12 is preferably 1 $\mu$ or more, and when it is formed following the electrode forming step, it preferably has the same thickness as that of the electrode, e.g., about 4 $\mu$. A width W of trimmed region 11c is about 9 $\mu$m. As shown in FIG. 2B, trimmed region 11c was irradiated with a laser beam having a spot diameter of less than 9 $\mu$, and the trimmed material in this region was cut off through the vaporizing process. A laser trimming device used was LX84, which is commercially available and manufactured by LTX Co., Ltd. The trimming is made to separate trimmed material by scanning a laser beam in a direction as shown by an arrow. The diameter of the laser spot is set to 10 $\mu$, the opening or slot of metal film 12 is set to be slightly narrower and to 9 $\mu$ in this embodiment. The diameter of a laser spot should be larger than the width of the slot of shield metal 12. The slight difference between the spot diameter and the slot width may be preferable, which are selected to a different length of 5~15%. FIG. 2D shows one example of an electric circuit using polysilicon layer 11 for short-circuiting. In this example, to obtain a resistance of resistor 14, polysilicon layer 11 is cut off (as indicated by mark X) by the trimming process according to the present invention.

In the above trimming process, when the laser beam used has the Gaussian distribution shown in FIG. 1A, a power distribution of the laser beam incident on the trimmed material 11 is as shown in FIG. 2E. In the figure, the distribution curve of of the laser power absorbed by the trimmed material was plotted under the condition that the center A of the applied laser spot is set at the center of trimmed region 11c. As seen from a configuration of the curve, the laser beam on the fringe of the trimmed portion is reflected by shield metal film 12 and does not reach the trimmed material thereunder. This indicates that only the trimmed material right under opening 13 of shield metal film 12 is evaporated by the laser beam. Under irradiation by the laser beam, the untrimmed region of the trimmed material is heated by the heat laterally transferred from evaporation region 11c, but its temperature rise is small and its melting hardly progresses, because most of the heat from the evaporation region is absorbed by shield metal film 12 of good heat conductivity. Therefore, melting region lb as shown in FIG. 1C is remarkably reduced, so that a phase of the trimmed material shifts from evaporation region 11c to solidus region 11a through the very narrow melting region. Thus, of the trimming process according to the present invention, the melting region possibly causing the protruded portion is remarkably reduced. Further, because the shield metal film is layered just above the melting region, occurrence of the protrusion in the fringe of the trimmed region is minimized.

Figure 3A:
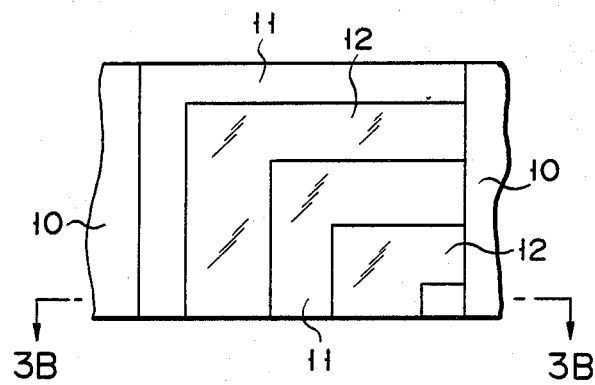
Figure 3B:
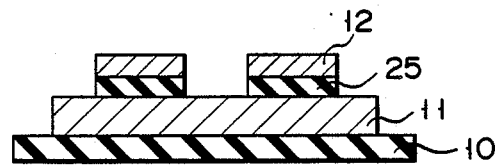
Figure 3C:
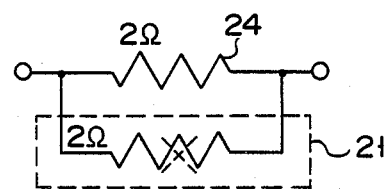

An example in which the trimmed material in the above embodiment is resistor film 11 made of Ni-Cr alloy, is shown in FIGS. 3A through 3C. In this instance, resistor film 11 is made of Ni-Cr alloy. An insulating layer, e.g., SiO$_2$ film 25, is interlayered between resistor film 11 and shield metal film 12. The insulating layer, which is for electrically insulating the films 11 and 12 one from another, is formed by the CVD process, for example, and is made of PSG or silicon nitride. In the case that trimmed material 11 is made of silicon, it may be a thermal silicon oxide film. A preferable thickness of insulating layer 25 is 1000 Å or less. This figure allows shield metal film 12 to effectively absorb the heat of the trimmed material.

Normally, resistance film 11 is connected in parallel with resistor 24 of 2 ohms, for example, and is used as a resistor element of 1 ohm. If necessary, resistance film 11 is disconnected or cut off (as indicated by mark X) from resistor 24 and is used as a resistor element of 2 ohms.

If the trimmed region 11C of trimmed material 11 with insulating film 2 layered thereover is irradiated with the laser beam, the trimmed material could be vaporized through the insulating film. In such a case, the insulating layer may be layered over the region to be irradiated with the laser beam, as shown in FIG. 4.

When the trimming is applied to only one side of trimmed material 11, as shown in FIG. 5, shield metal film 12 may be provided on only one side of the laser irradiated region.

While the above-mentioned embodiment referred to the trimmed material formed over the insulating layer on the substrate, it is evident that the present invention is applicable for the trimmed material formed over an insulating substrate such as a ceramic substrate. If the shield metal film has a higher reflectivity for the laser beam than the trimmed material or a good heat conductor is used, the beneficial effects by the present invention may sometimes be obtained. However, to reliably obtain such effects, it is preferable that the shield metal film be excellent in both reflectivity and heat conductivity.

As seen from the foregoing, in a trimming process by a laser beam according to the present invention, after the upper surface of the untrimmed region of a trimmed material is covered with a predetermined shield metal film, the trimming process based on the laser beam irradiation is performed. A resulting melting region of the trimmed material, which will cause a protruded portion, is very narrow, thus minimizing formation of the protruded portion. Therefore, a protecting film formed over the structure thus formed is reliable and can hermetically protect the structure for a long time.

What is claimed is:

1. A trimming process by a laser beam comprising the steps of:
    forming a laser shield layer over an untrimmed region of a trimmed material adjacent to a trimmed region, said laser shield layer having a higher heat conductivity than said trimmed material and a higher reflectivity for the laser beam than said trimmed material; and
    cutting off a first portion of said trimmed material by applying a laser beam onto the upper surface of said trimmed region of said trimmed material and vaporizing the trimmed material in said trimmed region.

2. The trimming process according to claim 1, in which said trimmed material is a resistor layer formed over an electrically insulating substrate.

3. The trimming process according to claim 2, in which said laser shield layer is directly mounted on a region of said trimmed material excluding said first portion.

4. The trimming process according to claim 2, in which said insulating substrate is substantially 1.2 $\mu$ thick and formed on a semiconductor layer.

5. The trimming process according to claim 1, in which said trimmed material includes a resistor film formed on an electrically insulating substrate, and an insulating film is formed between said resistor film and said laser shield layer, and electrically insulates said films one from another.

6. The trimming process according to claim 5, in which said insulating film has a thickness of 1000 Å or less.

7. The trimming process according to claim 1, in which said trimmed material is impurity doped polysilicon.

8. The trimming process according to claim 1, in which said laser shield layer is made of aluminum.

9. A trimming process by a laser beam comprising the steps of:
    forming a laser shield layer over an electrical resistor layer, said laser shield layer having a higher heat conductivity than said resistor layer and a large reflectivity for laser beams, and further having an opening through which said resistor layer is exposed;
    electrically separating said resistor layer at said opening by applying a laser spot to said resistor layer through said opening, and vaporizing said resistor layer within said opening, the diameter of said laser spot being larger than that of said opening.

10. The trimming process according to claim 9, wherein the opening of the laser shielding layer is a slot the width of which is slightly smaller than the diameter of the laser spot.

11. The trimming process according to claim 1, in which said trimmed material is nickel-chromium alloy.

12. A trimming process by a laser beam comprising the steps of:
    forming a laser shield layer over an untrimmed region of a trimmed material with a slot facing a trimmed region of the trimmed material to expose the trimmed region, said slot having an elongated center axis and a width, and said laser shield layer having a heat conductivity higher than said trimmed material and a higher reflectivity for the laser beam than said trimmed material; and
    applying a laser beam having a spot diameter larger than the width of the slot, onto the laser shield layer and the trimmed region exposed from the slot;
    relatively moving the laser beam so that its center is moved along the elongated center axis of the slot; and
    vaporizing the trimmed material of the trimmed region exposed from the slot to form a cut out portion having substantially the same width as the width of the slot, in the trimmed material.

13. The trimming process according to claim 11, wherein said spot diameter of the laser beam and the width of the slot are different in length at a rate of 5 to 15%.

14. A trimming process by a laser beam comprising the steps of:
    forming a laser shield layer over an untrimmed region of a trimmed material of an electrical conductivity with a slot facing a trimmed region of the trimmed material to expose the trimmed region, said slot having an elongated center axis and a width, said laser shield layer having a heat conductivity higher than said trimmed material and a higher reflectivity for the laser beam than said trimmed material, and said trimmed material connected in parallel with a resistor element; and
    applying a laser beam having a spot diameter larger than the width of the slot, onto the laser shield layer and the trimmed region exposed from the slot;
    relatively moving the laser beam so that its center is moved on the center axis of the slot, and vaporizing the trimmed material of the trimmed region exposed from the slot to form a cut out portion having substantially the same width as the width of the slot, in the trimmed material, whereby a current is prevented from flowing in the trimmed region.

* * * * *